United States Patent [19]

Hughes et al.

[11] 4,317,125
[45] Feb. 23, 1982

[54] FIELD EFFECT DEVICES AND THEIR FABRICATION

[75] Inventors: Brian T. Hughes, Sandy; John C. Vokes, Harpenden; David R. Wight, Hitchin, all of England

[73] Assignee: The Secretary of State for Defence in Her Britannic Majesty's Government of the United Kingdom of Great Britain and Northern Ireland, London, England

[21] Appl. No.: 43,979

[22] Filed: May 31, 1979

[30] Foreign Application Priority Data

May 31, 1978 [GB] United Kingdom ............... 25552/78

[51] Int. Cl.³ ........................................... H01L 21/302
[52] U.S. Cl. ...................................... 357/15; 29/571; 29/580; 29/589; 29/590
[58] Field of Search ................. 29/571, 580, 589, 590; 148/171, 172, 187; 357/15

[56] References Cited

U.S. PATENT DOCUMENTS

| | | | |
|---|---|---|---|
| 3,443,172 | 5/1969 | Koepp | 357/22 |
| 3,621,565 | 11/1971 | Sandstrom et al. | 25/590 |
| 3,914,137 | 10/1975 | Huffman et al. | 148/186 X |
| 3,930,912 | 1/1976 | Wisbey | 148/187 X |
| 3,972,770 | 8/1976 | Stein | 156/600 |
| 4,048,712 | 9/1977 | Buiatti | 357/23 X |
| 4,049,488 | 9/1977 | Tijburg | 156/655 |
| 4,104,672 | 8/1978 | Di Lorenzo et al. | 357/15 X |
| 4,193,836 | 3/1980 | Youmans et al. | 29/580 X |
| 4,223,327 | 9/1980 | Nara et al. | 357/15 |

FOREIGN PATENT DOCUMENTS

1514943 9/1969 Fed. Rep. of Germany .
2386903 11/1978 France .

*Primary Examiner*—G. Ozaki
*Attorney, Agent, or Firm*—Pollock, Vande Sande & Priddy

[57] ABSTRACT

A method of fabricating a field effect transistor comprising the steps of forming an active layer of semiconductor material, e.g., GaAs, over a surface of a first substrate of semiconductor material, e.g., also GaAs, forming a gate electrode on the surface of the active layer, applying a second substrate of insulating material to the surface of this structure, removing the first substrate, and forming source and drain electrodes on the opposite surface of the active layer to the gate electrode. To facilitate removal of the GaAs first substrate by selective etching, a buffer layer of GaAlAs resistant to the GaAs etchant, may be formed between the active layer and the first substrate, which buffer layer is removed, following removal of the first substrate, using a selective etchant to which the GaAs active layer is resistant. A second gate electrode may be formed on the opposite surface of the active layer to that on which the first gate electrode is formed. The technique is particularly applicable to high frequency FET devices.

33 Claims, 13 Drawing Figures

FIELD EFFECT DEVICES AND THEIR FABRICATION

CROSS REFERENCE TO RELATED APPLICATIONS

The subject matter of the instant application is related to the inventions described and claimed in Hughes et al application Ser. No. 43,977 and Hughes et al U.S. application Ser. No. 44,274, each filed May 31, 1979, for "Improvements In Or To FET Devices And Their Fabrication".

This invention relates to methods of fabricating field-effect transistors (FETs) and to FET devices fabricated by such methods.

Conventional low-noise microwave FETs normally comprise a high resistivity or semi-insulating semiconductor substrate formed with a thin high-quality epitaxial active layer on which the source, gate and drain electrodes are formed.

Theoretical and experimental evidence suggests that the performance of conventional low-noise microwave FETs, and also to a certain extent power FETs is limited because of a reduction in the mutual conductance ($g_m$) of the device as the gate bias is increased towards pinch-off. It is thought that the major reason for this reduction in mutual conductance is that charge carriers in the active channel region underlying the gate electrode are forced into the substrate at high gate biases, with a resultant "softening" of the I-V characteristics. To enable high mutual conductance to be achieved near pinch-off, it is desirable to maintain the charge carriers within the active layer.

It has been proposed to adapt the technology developed for the fabrication of GaAs photocathodes to the fabrication of low-noise non-coplanar GaAs FETs to enable the active channel region underlying the gate electrode to be interfaced to a good insulator instead of to the usual high resistivity or semi-insulating GaAs substrate, and to enable the gate electrode be placed on the opposite side of the active layer to the source and drain electrodes (non-coplanar.) A method of fabricating such an FET is described in Annual Report No. (1976-1975) prepared by D. R. Decker and S. G. Bandy of Varian Associates, Palo Alto, Calif. under contract No. N00014-75-C-0303 with the U.S. Office of Naval Research, which publication is abstracted in U.S. Government Reports Announcements, Vol. 77, No. 5, field 9A under No. ADA032809.

The described method involves formation of ohmic source and drain electrodes on the surface of an epitaxial active layer formed on a semiconductor substrate; sealing this surface to a dielectric support substrate; removing the original semiconductor substrate using differential etching; and then forming a gate electrode on the surface of the active layer opposite to that on which the source and drain electrodes are formed.

The proposed prior art fabrication technique results in a non-coplanar FET structure in which the source and drain electrodes lie beneath the active layer and the gate electrode lies above it. The dielectric support substrate is sealed to the surface of the active layer opposite to that on which the gate electrode is formed, using a low temperature glass, a process which must be carried out above the melting point temperature of the glass, typically at about 700° C. At such temperatures there is a liklihood of deterioration of the active layer at or near its interface with the low temperature glass as a result of the relatively high temperature sealing operation and thermal expansion mismatch between the glass and the active layer.

According to the present invention, a method of fabricating a field effect transistor comprises the steps of forming an active layer of semiconductor material over a surface of a first substrate of semiconductor material, forming a gate electrode on the surface of the active layer, applying a second substrate of insulating material to the surface of the structure comprising the first substrate and active layer so that the active layer lies between the two substrates, removing the first substrate, and forming source and drain electrodes over the opposite surface of the active layer to the gate electrode.

Preferably a high quality buffer layer of semiconductor is formed on the surface of the first substrate prior to formation of the active layer, and is removed following removal of the first substrate before formation of the source and drain electrodes.

The first substrate may be removed by etching using a selective etchant which attacks the first substrate at a faster rate than it attacks the buffer layer, and the buffer layer may also be removed by etching using a selective etchant which attacks the buffer layer faster than it attacks the active layer.

Preferably the first substrate is GaAs, the active layer n-type GaAs and the buffer layer GaAlAs removed by etching using HF.

Preferably prior to application of the second substrate, a recess is formed extending partially through the thickness of the active layer from the free surface thereof, and the gate electrode is formed in said recess.

To improve the quality of the (ohmic) contact between the source and drain electrodes and the active layer, a layer of high conductivity semiconductor material may be interposed therebetween.

Advantageously, a second gate electrode may be formed in contact with the opposite surface of the active layer to that on which the first gate electrode is formed. The second gate electrode may be formed in contact with part of the first gate electrode, or in electrical isolation therefrom so as to be capable of operating as independent electrodes in operation of the device.

The second gate electrode will normally be formed immediately opposite and in register with the first gate electrode, although in some applications it may be offset with respect thereto to effectively reduce the length of the conducting channel.

The second substrate which may be of any suitable insulating material, may be applied to the surface of the structure comprising the first substrate and active layer using any suitable technique.

Preferably however, a coating of insulating material is first formed on the appropriate surface of the said structure prior to application thereto of the second substrate, using an adhesive for example. The requirements of such an adhesive, or the means by which the second substrate is applied to the insulating coating, in terms of its thermal, chemical and electrical compatibility with the active layer can be considerably relaxed if the coating itself is compatible with the active layer, an easier requirement to meet.

The invention will now be further described, by way of example only, with reference to the accompanying drawings in which.

Referring to the drawings, FIGS. 1(a) to 1(d) represent various stages in the fabrication of a low-noise microwave FET in accordance with the invention commencing with a first substrate 1 of semi-insulating GaAs several hundred $\mu$m thick. The method comprises first forming a buffer layer 2 of GaAlAs of the order of 2 to 5 $\mu$m thick on a surface of the substrate 1, followed by a thin high conductivity (n+) layer 3 of highly doped (concentration of the order $2 \times 10^{18}$ cm$^{-3}$) GaAs of the order 0.2 to 0.5 $\mu$m thick, followed by an n-type semiconductor active layer 4 of GaAs (doped to a concentration of the order of $1 \times 10^{17}$ cm$^{-3}$) of the order of 0.2 to 1 $\mu$m. Each of the above layers is formed by liquid or vapor phase or molecular beam epitaxy using known techniques.

A gate electrode, e.g., of aluminum, comprising a narrow gate line portion 7 of the order of 0.5 to 1 $\mu$m long and several hundred $\mu$m wide extending from an enlarged contact pad portion 6 (not seen in FIG. 1) is then formed on the active layer as a Schottky barrier contact therewith. For a purpose which will become apparent below, a recess 10 corresponding in shape, but generally larger in size than the gate electrode, is first etched in the active layer using conventional photo-or electron lithographic masking techniques, and the gate electrode then formed in the recess 10 using the same mask.

Following formation of the gate electrode, a second substrate 11 of any suitable insulating material ideally having good mechanical properties, chemical stability and good thermal properties is applied to the semiconductor structure comprising the first substrate 1 and active layer 4. This insulating substrate 11 will eventually provide the support substrate for the completed device.

Figure 1A:
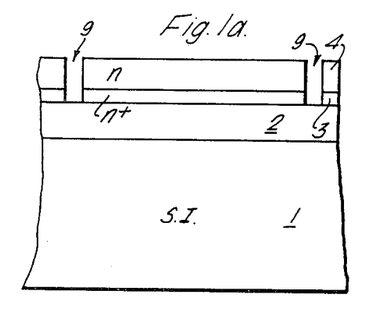
FIGS. 1(a) to 1(d) represent in diagrammatic form various stages in the fabrication of one microwave FET in accordance with the invention.
Figure 1B:
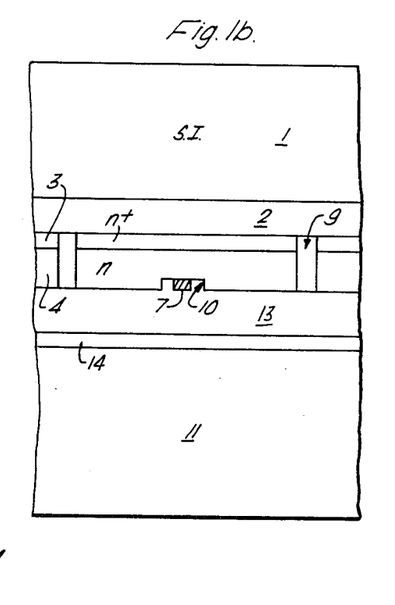

In order to enable etch masks used in later stages of the fabrication process to be aligned with the gate electrode, which at these later stages will underlie the active layer, alignment holes 9 are formed through the active and high conductivity GaAs layers 4,3 prior to application of the second substrate 11 FIG. 1(a).

The method by which the second substrate 11 is applied to the semiconductor structure and the materials used, are determined to a large extent by the need to avoid degradation of the active layer 4 and the Schottky barrier gate electrode, and also by the requirement that the bond between the second substrate and the semiconductor structure should not be affected by the temperatures and chemicals to which the structure is subjected in later stages of the fabrication process. The thickness of the second substrate is not critical, typically being of the order of 2 mm.

A preferred method of applying the second substrate 11 which may be of any suitable insulating material, in the present example alumina, comprises first forming on surface of the active layer 4 a coating 13, of insulating material, typically several tens of microns thick, which is a good thermal expansion match and chemically inactive with GaAs, and also has good microwave properties. The second substrate 11 is then applied to this low-loss coating 13 using a suitable adhesive.

One suitable insulating material for the coating 13 is polyimide resin, such as that sold under the name of KERIMID (Registered Trade Mark) 601 by Rhone Poulenc, a condensation-type polymer resin. The resin, which is sold in powdered form is first dissolved in a solvent, applied to the surface of the active layer 4 and the coated structure then spun at high speed to achieve a uniform coating of the desired thickness. The solvent is then dried by heating to a temperature of about 120° C. before curing at a temperature of the order of 220° C. to give a hardened substantially bubble-free coating.

To improve the quality of the coating 13, it may be built up from a number of successively applied thinner layers (typically each of sub-micron thickness) successive layers being cured before application of the next.

Any suitable adhesive 14, which need not have such good microwave properties, nor be such a good thermal expansion match or chemically inactive with GaAs, may then be used to apply the second substrate 11 to the coating 13. For the purposes of the present embodiment, the same polyimide resin material may be used as the adhesive 14 either applied as a solution and then cured to form the bond, or in powder form sandwiched under pressure between the second substrate 11 and the coating 13 and then heated to curing temperature.

Other suitable materials which may provide the low-loss coating 13 include $SiO_2$, polycrystalline GaAs, $Si_3N_4$, alumina and glass applied by sputtering, evaporation, or ion beam deposition as appropriate all of which can be carried out at suitably low temperatures to avoid degradation of the Schottky contact and active layer. A further possibility in the case of glass is to apply it as a glass frit, e.g., using borosilicate glass, which is then heated to melting point to form a fused glass coating. However this method requires heating to a relatively high temperature depending on the type of glass used.

Furthermore, the second substrate 11 need not be applied to the coating 13 using an adhesive. It may for example be formed in situ on the coating 13 using any suitable technique, and may be of the same or different material as the coating.

The purpose of the coating 13 is to provide a good quality mechanical barrier immediately adjacent the sensitive active layer which permits a wider range of materials and techniques to be used in applying the second substrate by relaxing the chemical, thermal and microwave properties required of them. The coating 13 could of course be omitted, and the second substrate applied directly to the surface of the semiconductor structure, using an adhesive for example.

To facilitate the dicing operation carried out at the end of the device fabrication to separate the structure into individual device chips, the second substrate is lapped down to a thickness of the order of 0.4 mm, and a series of slots 15 then cut into its rear surface along which structure will later be cleaved. During these operations the active layer is protected on opposite sides by the first and second substrates.

Figure 1C:
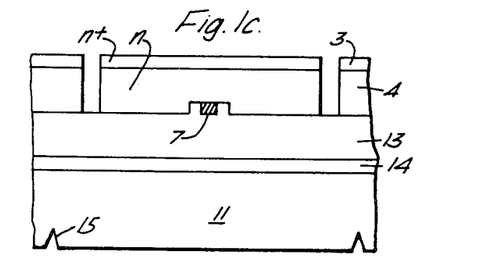
Figure 1D:
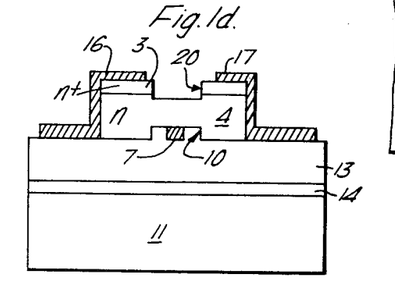

The next stage in the fabrication procedure is the removal of the first substrate 1 and the buffer layer 2 using selective etchants. The first substrate is removed using a 95:5 mixture of 100 V $H_2O_2$ and 35% $NH_4OH$ which attacks GaAs at a much faster rate (about two orders of magnitude) than it attacks GaAlAs, the GaAlAs thus acting as a chemical stop causing the etch to stop abruptly at the GaAs/GaAlAs interface. [With respect to the term 100 V $H_2O_2$ referred to in the preceding sentence, the unit "volume" (abbreviation "V") is the standard unit used to measure the strength of $H_2O_2$ solution (i.e., $H_2O_2$ dissolved in water) and is defined as follows: x Volume $H_2O_2$ solution will evolve x times its own volume of oxygen gas on complete decomposition to water+oxygen.] The GaAlAs buffer layer 2 is then removed using a different selective etchant, a 50% solution of HF which attacks GaAlAs at a much faster rate than it attacks GaAs (the rate being dependent upon the proportion of Al in the GaAlAs), so that the underlying high-conductivity GaAs layer 3 acts as a chemical stop to the HF etchant. The resultant structure is shown in FIG. 1(c) comprising an insulating substrate 11, supporting the active and high conductivity GaAs layers 4,3 above the adhesive layer 14 and the low-loss coating 13, with the gate electrode 7 now underlying the active layer 4.

Parts of the high conductivity and active layers 3,4 are then removed by etching using a photo-or electron-lithographically formed resist mask suitably aligned with the alignment holes 9 revealed by the removal of the first substrate 1 and buffer layer 2, to form a separate isolated mesa for each device on the surface of the low-loss coating 13.

The resulting mesa overlies only the gate line portion 7 of the gate electrode, the contact pad portion 6 now being exposed, and the dimension of the mesa in the direction of elongation of the gate line 7 corresponding to the desired width of the device channel.

Source and drain electrodes 16,17 are then formed over the high conductivity layer 3 on top of the mesa, in alignment with, and on opposite sides of the gate line 7, by first providing a photo-or electron-lithographically formed resist mask, forming a metallization layer, eg of Ge Au, over the mask, floating off the metallization layer overlying the resist mask, and then annealing at about 450° C. to form ohmic source and drain contacts. The presence of the high conductivity layer 3, which is optional, is to improve the quality of the ohmic contact between the source and drain electrodes 16,17 and the active layer 4 as is well known in the art. The electrodes 16,17 extend away from the gate line 7 over the edge of the mesa onto the surface of the low-loss coating 13 to provide contact pads for external connections to the device. Alternatively, the mesa may be made larger and source and drain electrodes formed wholly thereon.

Following formation of the source and drain electrodes 16, 17, a region of the high conductivity layer 3 lying between the source and drain electrodes 16,17 and immediately opposite the gate line 7, is etched away to form a recess 20 exposing the underlying active layer 4. During the same etching process, a surface area of this active layer is also etched away to effect removal of the active layer material immediately adjacent to its interface with the high conductivity layer 3 (or where no such layer is provided, with the GaAlAs buffer layer 2) and/or to reduce the thickness of the active layer in this channel region to that required to give a desired channel current. This procedure also removes any criticality in the thickness to which the active layer is originally grown.

The substrate 11 is then diced up into individual device chips by cleaving along the pre-formed slots 15 in its rear surface.

Figure 2:
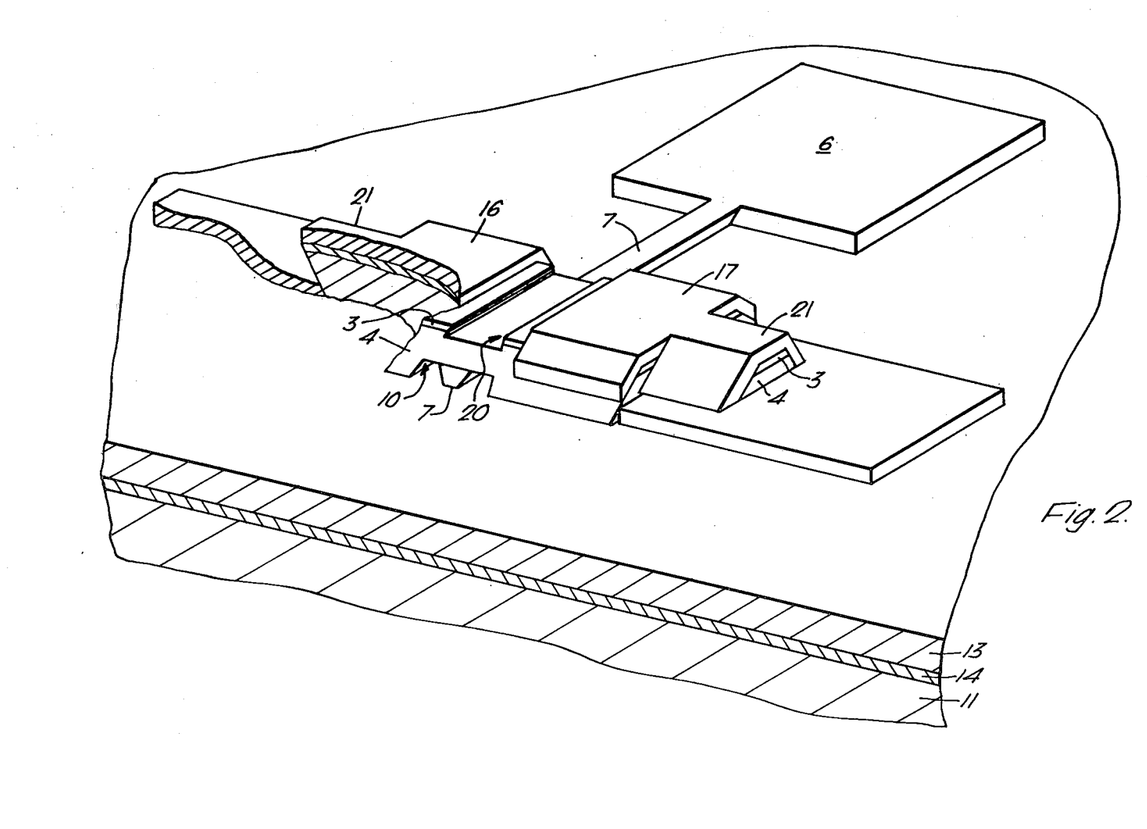
FIG. 2 is a perspective diagrammatic representation of a FET fabricated by the method illustrated in FIG. 1.

A typical completed device structure is shown in FIG. 2, from which it will be seen that the inclination of the etched edges of the GaAs mesa and the recesses 10,20 formed therein are inclined, the sense of the inclination being determined by the crystal orientation where an orientation sensitive etchant such as 1:1 by volume 0.05 NaOH and 5 V $H_2O_2$ is used (with respect to the term 5 V $H_2O_2$, see the definition given previously). In the structure shown, the orientation has been selected to produce a recess 10 of 'V' cross section in which the gate line 7 is formed and a recess 20 of 'A' cross-section on the opposite side of the active layer 4. However, this produces undercut, or inwardly sloping edges to the mesa where the source and drain electrodes 16,17 pass from the mesa onto the surface of the low-loss coating 13.

Figure 3:
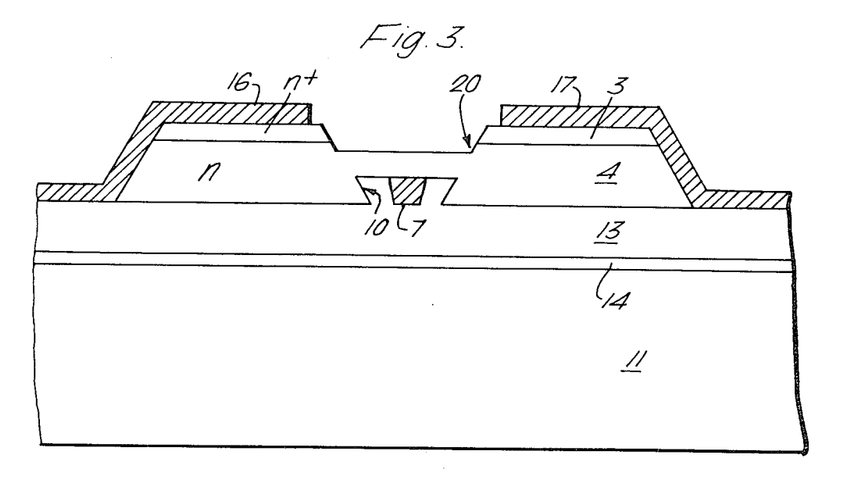
FIG. 3 is a diagrammatic sectional view through a modified form of FET in accordance with the invention.

To maintain continuity of the source and drain electrodes as they pass over the edge of the mesa, the mesa is formed with castellations 21 as shown, whereby the source and drain electrodes extend continuously onto the surface of the surrounding structure over the outwardly sloping sides of the castellations. The need for these castellations 21 may be obviated by selecting the alternative crystal orientation as illustrated in FIG. 3 or by making the mesa larger and forming the source and drain electrodes wholly thereon as mentioned earlier.

An alternative method of removing GaAs to form the recesses 10, 20 and mesa, is ion milling. As this technique is independent of crystal orientation, the above difficulties associated with draping the source and drain electrodes do not arise.

The method in accordance with the invention provides a non-co-planar field effect transistor in which the channel region of the active layer opposite the gate electrode is interfaced to air rather than to a semi-insulating substrate as in conventional devices, thereby enabling improved low-noise operation to be achieved. Having the source and drain electrodes on the opposite side of the active layer, to the gate electrode (non-co-planar), reduces the criticality in their alignment, enables a shorter channel length to be used, and reduces parasitics between the gate and source and drain electrodes.

A further advantage of the present invention is that it enables a second gate electrode to be provided on the opposite surface of the active layer to the existing gate electrode. By positioning the second gate electrode immediately opposite and in register with the first gate electrode, the channel region of the device is sandwiched between the two as illustrated in FIGS. 4 and 5.

Figure 4:
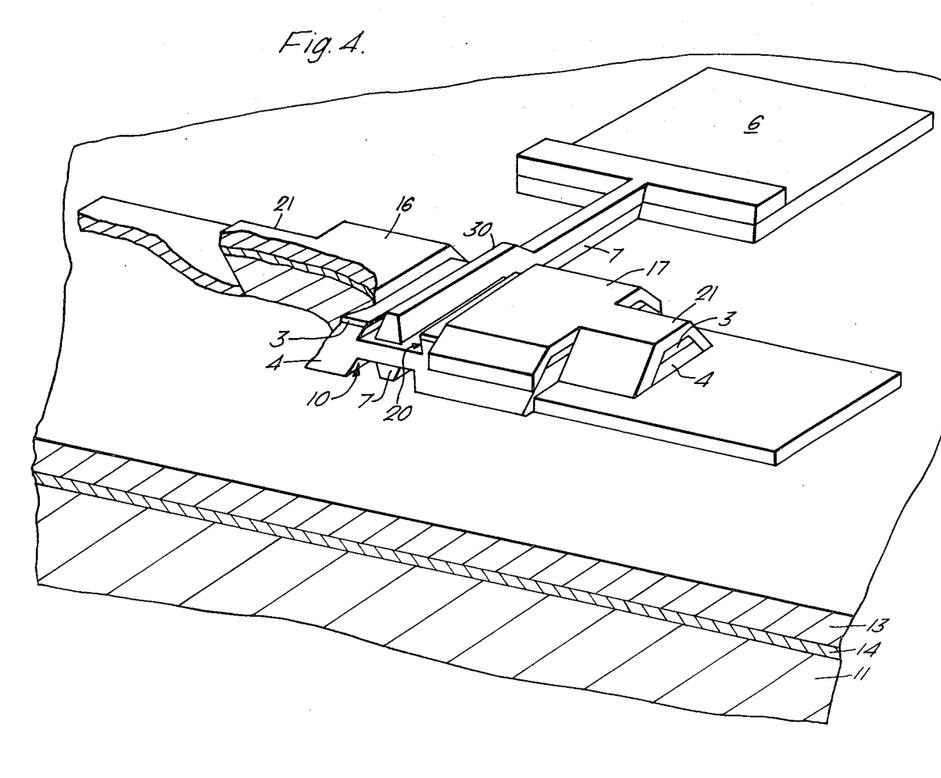
FIGS. 4, 5 and 6 illustrate further modified forms of FET in accordance with the invention.
Figure 5:
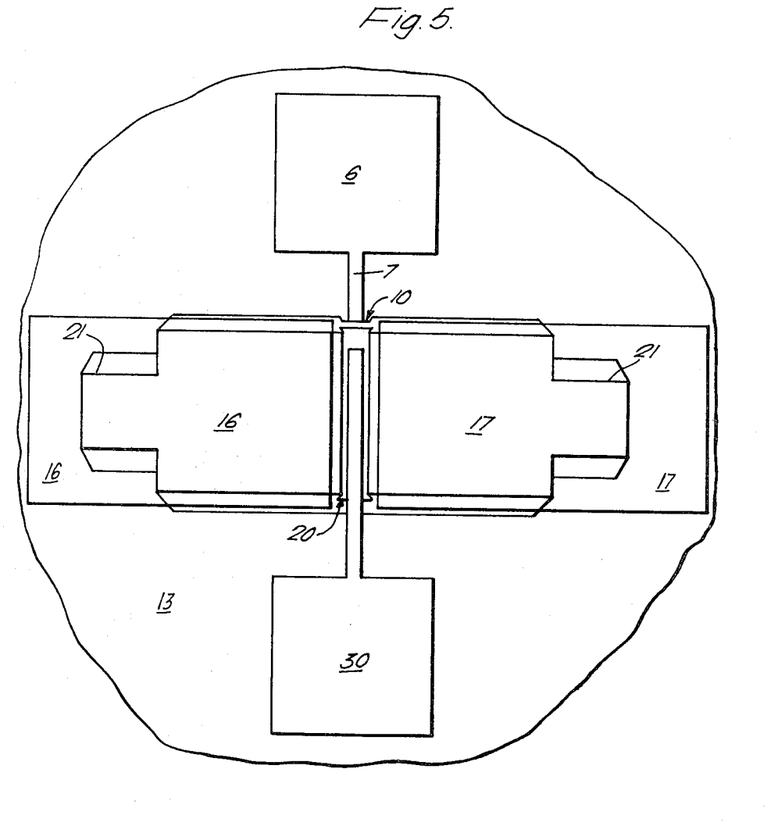

In FIG. 4, the second gate electrode 30 is formed in electrical contact with the first gate electrode 6, 7, while in the device illustrated in FIG. 5, the two gate electrodes are electrically independent, traversing opposite edges of the mesa. The crystal orientation is selected in both examples such that the second gate electrode 30 passes over an outwardly sloping edge of the mesa thus ensuring electrical continuity (FIG. 2 orientation).

A particular advantage of the FIG. 4 arrangement is that the gate resistance is reduced by a factor of four for a given gate width (i.e., in the direction of elongation), while in the FIG. 5 arrangement, different biases and signals can be applied to the two independent gates, in operation, enabling the device to be used for example, as a mixer, by applying an input signal to one gate and connecting a local oscillator to the other, or to be used as an AGC amplifier by applying an input signal to one gate and an AGC voltage to the other, or to be used as a high speed logic element.

In this latter connection, a single device could be made to act as a NAND, a NOR or a NOT gate by selecting the thickness of the active layer in the channel region in accordance with the design of a NAND gate, in which in operation an output signal is produced only by simultaneous application of negative biases to both gate electrodes (nominally held at 0 volts) to achieve pinch-off and thereby a positive increase in drain voltage.

The same device may then be made to operate as a NOT gate by applying a permanent negative bias voltage equal to half the required pinch-off voltage to one of the gate electrodes. Application of a similar negative bias to the other gate will then cut off the channel current and produce an output represented by a positive increase in drain voltage. By similarly biasing one of the gates as for the NOT gate, operation as a NOR gate may also be achieved in that a negative signal on either gate will produce pinch-off.

Thus, the logic function of a single device may be changed electronically rather than by electrical connections. Alternatively, the devices may be designed to operate either as NAND, NOR or NOT gates without biasing by appropriate selection of the thickness of the active layer in the channel region, the NAND gate then having twice the channel thickness of a NOR or NOT gate.

In logic applications where such FETs are normally-off under zero gate bias, the provision of a second independently controllable gate electrode enables variations in the thickness and/or doping characteristics of the active channel region (e.g., due to fabrication tolerances) to be compensated by applying a suitable bias to one of the two gates ensuring that the depletion regions meet when there is no bias on the other gate. In use, the correction bias applied to one of the gates may be individually adjusted to correct individual devices, or to correct individual integrated circuits or portions of integrated circuits.

Although in the embodiment illustrated in the drawings, the second gate electrode is placed immediately opposite and in register with the first gate electrode, this need not be the case. For example, the second gate electrode may lie parallel to, but offset with respect to the first gate electrode in the direction of charge transfer, whereby to produce a device having an effectively reduced channel length, desirable for high frequency operation.

For some applications more than one gate electrode may be provided on one or both sides of the active layer.

Figure 6:
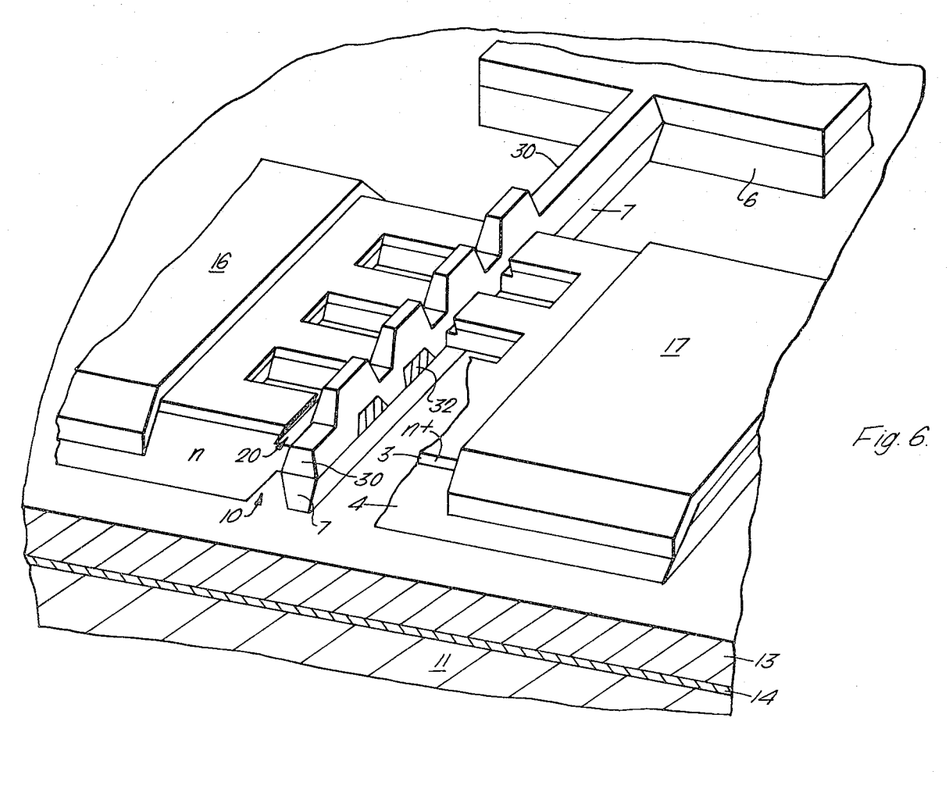
Figure 7A:
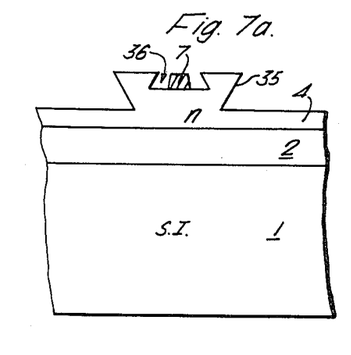
FIG. 7 represents in diagrammatic form various stages in a modified method of fabricating an FET in accordance with the invention.
Figure 7B:
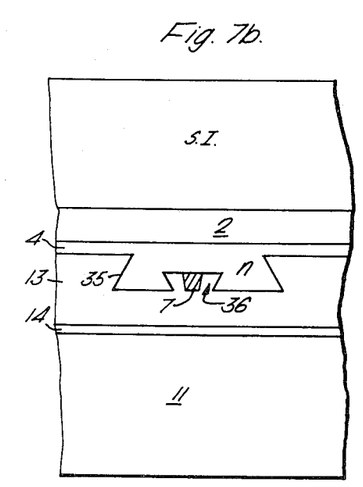
Figure 7C:
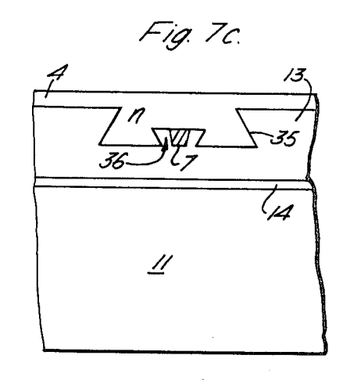
Figure 7D:
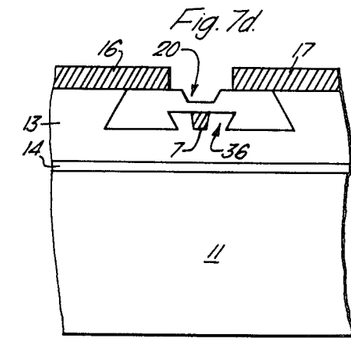

A modified form of the device shown in FIG. 4 is illustrated in FIG. 6, in which discrete areas of the active layer 4 in the channel region between the source and drain electrodes 16,17 are etched away (either before or after formation of the source and drain electrodes) leaving a number of filaments 32 of active GaAs extending across the first gate line 7. The second gate electrode 30 is then formed in register with the first gate electrodes making contact therewith through the holes between the filaments 32 as well as at both ends.

The device thus has a plurality of filamentary active channels each completely surrounded by gate metallization. If the aspect ratio of each filament is made approximately square, each filamentary channel will be structurally similar, and thus have similar electrical properties, to a conventional cylindrical FET. Each filamentary channel will be pinched-off from all directions during operation rather than from two opposing planes, enabling lower gate capacitances to be achieved and possibly further improving the device mutual conductance. In a practical device, there may be up to several hundred such filamentary channels.

An alternative fabrication procedure may be used for any of the above devices, in which the mesa is defined before formation of the gate electrodes 6,7. Various stages in this modified procedure are illustrated in FIGS. 7(a) to 7(d).

Thus following formation of the GaAlAs buffer layer 2 and the active GaAs layer 4 on the surface of the semi-insulating GaAs substrate 1 (the high conductivity layer 3 being omitted in this procedure for the sake of clarity) part of the active layer 4 is etched away through part of its thickness to define a mesa 35 surrounded by an active layer of reduced thickness. As before a recess 36 corresponding to the recess 10, is then formed in the top surface of the mesa and the gate electrode formed with a narrow elongated gate line portion 7 extending over the mesa edge into an enlarged contact pad portion 6 remote from the mesa. The orientation of the GaAs is selected to enable the gate line 7 to traverse the mesa edge over an outwardly sloping surface.

The remaining device fabrication procedure is then substantially as described above in connection with FIG. 1 up to removal of the GaAlAs buffer layer 2, after which the whole surface of the active layer is free-etched, at least through its reduced thickness, thereby isolating the mesa 35 and exposing the contact pad portion 6 of the gate electrode. The source and drain electrodes 16,17 are then formed as before, and where required, a recess 20 etched to provide the required channel thickness.

A second gate electrode (not shown) may then be provided as before.

Where a high conductivity layer is provided to improve the quality of the ohmic contacts as described earlier, then part of the thickness of this layer rather than the active layer may provide the reduced thickness of GaAs which is free etched to isolate the mesa 35, the recess 20 then extending through the remaining thickness of this layer on top of the mesa prior to formation of the gate electrode. Alternatively the mesa may be completely isolated before application of the second substrate by completely removing the surrounding area of the active layer, and high conductivity layer where provided, at this stage.

A further advantage which arises from the non-coplanar geometry of the FETs fabricated in accordance with the present invention is that a plurality of such devices having only one gate may not be connected together in parallel on a common chip without the need for bond wires or additional overlay techniques. The gate electrodes of adjacent devices can be connected together by a common bus line running along one side of a row of the devices beneath the active layer 4. No individual mesas need be formed in the active layer. The source electrodes and the drain electrodes of the devices are connected together by respective source and drain bus lines running along opposite sides of the row of devices above the active layer, which thus insulates the gate bus line from the overlying source and drain bus lines. In this connection, prior to formation of the source and drain electrodes and bus lines, regions of the active layer other than the channel regions may be rendered highly resistive by proton bombardment in a known manner, thereby effectively isolating the channel regions of adjacent devices.

An alternative method of selective etching which may be used to remove the first substrate is described in "Preferential Etch Scheme for GaAs-GaAlAs" by C. B. Burstell, R. Y. Hung and P. G. McMullin, IBM Technical Disclosure Bulletin, Vol. 20, No. 6, p. 2451, November 1977.

Although it is preferred to fabricate devices in accordance with the present invention using GaAs as the semiconductor material, the invention is not necessarily restricted to the use of this particular material.

What we claim is:

1. A method of fabricating a field effect transistor comprising the steps of forming an active layer of semiconductor material over a surface of a first substrate of semiconductor material, forming a gate electrode on the surface of the active layer, applying a second substrate of insulating material to the surface of the structure comprising the first substrate and active layer so that the active layer lies between the two substrates, removing the first substrate, and forming source and drain electrodes over the opposite surface of the active layer to the gate electrode.

2. A method as claimed in claim 1, wherein a high quality buffer layer of semiconductor material is formed on the surface of the first substrate prior to formation of the active layer, and is removed following removal of the first substrate before formation of the source and drain electrodes.

3. A method as claimed in claim 2, wherein the buffer layer is removed by etching using a selective etchant which attacks the buffer layer faster than it attacks the active layer.

4. A method as claimed in claim 3, wherein the first substrate is removed by etching using a selective etchant which attacks the first substrate at a faster rate than it attacks the buffer layer.

5. A method as claimed in claim 2, wherein the first substrate is semi-insulating GaAs, the active layer is n-type GaAs, and the buffer layer is GaAlAs removed by etching using HF.

6. A method as claimed in claim 1, wherein the source and drain electrodes are formed on the surface of a layer or high conductivity semiconductor material originally formed over the surface of the first substrate immediately before formation of the active layer on its surface, and wherein, following removal of the first substrate, a region of the high conductivity layer immediately opposite the gate electrode is removed thereby exposing a region of the underlying active layer immediately opposite the gate electrode.

7. A method as claimed in claim 1, 2 or 6, wherein each of said layers is epitaxially formed.

8. A method as claimed in claim 1, wherein, prior to application of the second substrate, a recess is formed extending partially through the thickness of the active layer from the free surface thereof, and the gate electrode is formed in said recess.

9. A method as claimed in claim 1 wherein, following removal of the first substrate, a surface thickness of the active layer is removed at least in the region immediately opposite the gate electrode.

10. A method as claimed in claim 9, wherein said surface thickness is removed by forming a recess in the surface of the active layer following formation of the source and drain electrodes.

11. A method as claimed in claim 1, wherein following removal of the first substrate a second gate electrode is formed in contact with the opposite surface of the active layer to that on which the first gate electrode is formed.

12. A method as claimed in claim 11, wherein the second gate electrode is formed in electrical contact with the first gate electrode.

13. A method as claimed in claim 11, wherein the second gate electrode is formed in electrical isolation from the first gate electrode.

14. A method as claimed in claim 12 or 13, wherein the second gate electrode is formed directly opposite and in register with the first gate electrode.

15. A method as claimed in claim 12 or 13 wherein the second gate electrode is offset with respect to the first gate electrode whereby to effectively reduce the length of the conducting channel of the device.

16. A method as claimed in claim 1, wherein following removal of the first substrate part of the active layer is removed to define an isolated mesa overlying the gate electrode formed prior to application of the second substrate, and the source and drain electrodes are formed in ohmic contact with the top surface of the mesa.

17. A method as claimed in claim 16, wherein the source and drain electrodes are each formed with a portion extending over the edge of the mesa onto the surrounding surface of the structure to provide contact pads for external connection to the device.

18. A method as claimed in claim 16, wherein formation of the mesa exposes a portion of said gate electrode which provides a contact pad for external connection to the device.

19. A method as claimed in claim 18, wherein following removal of the second substrate, a second gate electrode is formed in contact with the top surface of the mesa, with a portion which extends over the edge of the mesa into contact with the contact pad portion of the first gate electrode.

20. A method as claimed in claim 18, wherein following removal of the second substrate, a second gate electrode is formed in contact with the top surface of the mesa with a portion which extends over an edge of the mesa to provide a contact pad therefore on the surface surrounding the mesa isolated from the contact pad portion of the first gate electrode.

21. A method as claimed in claim 1, wherein prior to formation of said gate electrode on the surface of the active layer opposite the first substrate, an area of the active layer is removed through at least a part of its thickness to define a mesa, the gate electrode then being formed on top of the mesa with a portion extending over the edge thereof onto the surface of the structure surrounding the mesa to provide a contact pad for the gate electrode in the completed device.

22. A method as claimed in claim 18, wherein following removal of the second substrate, a second gate electrode is formed with a portion which extends over the edge of the mesa into contact with the contact pad portion of the first gate electrode.

23. A method as claimed in claim 1, wherein the second substrate is applied to the structure comprising the first substrate and active layer by first coating the appropriate surface of the said structure with a coating of insulating material and then applying the second substrate to said coating.

24. A method as claimed in claim 23, wherein the second substrate is bonded to the said insulating coating using an adhesive.

25. A method as claimed in claim 23 or 24, wherein the insulating coating comprises a polyimide resin applied in liquid form and cured before application of the second substrate.

26. A method as claimed in claim 23 or 24, wherein the insulating coating comprises $SiO_2$ applied either by evaporation or sputtering.

27. A method as claimed in claim 1 or 23, wherein the second substrate in formed in situ.

28. A method as claimed in claim 27, wherein the second substrate is formed by moulding.

29. A method as claimed in claim 28, wherein the second substrate comprises polyimide resin.

30. A method as claimed in claim 1, wherein the second substrate is applied directly to the structure comprising the first substrate and active layer by means of an insulating adhesive.

31. A method as claimed in claim 30, wherein said insulating adhesive comprises polyimide resin.

32. A field effect transistor fabricated by a method as claimed in claim 1, 11, 21 or 23.

33. A field effect transistor fabricated by a method as claimed in claim 12, wherein the first and second gate electrodes make contact with one another in at least two places separated by a part of the active layer between the source and drain electrodes, thus providing a conducting channel for the device completely surrounded by gate electrode metallization.

* * * * *